April 18, 1961 R. C. SWENGEL 2,980,878

CLIP CONNECTOR FOR PRINTED CIRCUIT BOARD

Filed Feb. 11, 1957 2 Sheets-Sheet 1

INVENTOR.
ROBERT C. SWENGEL

BY

Curtis, Morris + Safford

April 18, 1961 R. C. SWENGEL 2,980,878

CLIP CONNECTOR FOR PRINTED CIRCUIT BOARD

Filed Feb. 11, 1957 2 Sheets-Sheet 2

INVENTOR.
ROBERT C. SWENGEL

BY

Curtis, Morris & Safford

United States Patent Office 2,980,878 Patented Apr. 18, 1961

2,980,878

CLIP CONNECTOR FOR PRINTED CIRCUIT BOARD

Robert C. Swengel, Hellam, Pa., assignor to AMP Incorporated, Harrisburg, Pa.

Filed Feb. 11, 1957, Ser. No. 639,461

13 Claims. (Cl. 339—17)

This invention relates to printed circuit connections and more particularly to an improved printed circuit board or panel and terminal clips cooperable therewith for making connections between the electrical network defined by the printed circuit board and electrical circuitry external to the printed circuit board.

As used herein, the term printed circuit board includes a supporting base or body of any suitable insulating material on which the electrical wiring of an electronic circuit is reproduced by any suitable process such as chemical deposition, die stamping, painting, etc. The circuit design may encompass both sides of the panel and may be printed with or without other circuit parameters such as resistors, capacitors, etc., the wiring usually taking the form of extremely thin and narrow strips or ribbons of electrically conductive material such as copper, silver, or tin, or a combination thereof.

It is therefore an object of the present invention to provide electrical connections with printed circuit boards which are simple in construction and in installation and inexpensive to produce;

Another object is to provide a printed circuit connection for external wiring which may readily be disconnected for disassociating the printed circuit unit from the remainder of the system;

Another object of the present invention is to provide a printed circuit panel connection wherein an external lead wire is directly coupled to the printed circuit conductive ribbons through a single solderless terminal part;

Still another object is to provide in a friction fit connection for printed circuit panels, connector parts which are self-cleansing, require low connective forces, but result in high contact pressures over the contact areas without damage to the conductive ribbons of the printed circuit panel;

Stil lanother object is to provide in a frictional fit connection for printed circuit panels, a terminal clip sufficiently resilient to accept wide variations in thickness of the insulation body and to overcome plastic creep of the insulation under load;

A still further object is to provide in a frictional fit connection for printed circuit panels a terminal clip which promotes the circulation of air for ventilation purposes and avoids entrapment of moisture or other foreign matter within the connector parts;

A still further object is to provide in a friction fit connection for printed circuit panels a terminal clip which is mechanically stable under vibration or externally imposed stresses on the lead-in wires.

In general these and other objectives are attained in accordance with the present invention by providing in a printed circuit panel a plurality of slots which extend inwardly from one or more of the side edges of the panel, the number of slots corresponding to the number of external connections desired. Incorporated within the circuit design printed on the panel are a number of conductive ribbons leading from the input and output junctions of the circuitry involved, which ribbons extend to the panel side edges along and adjacent appropriate slots. These slots are adapted to receive a sheet metal terminal which includes a coupling portion adapted for solderless connection to electrical circuitry, such as a lead-in wire external of the panel, and a clip portion which comprises a base and resilient spring elements extending from the base, for example a pair of lateral arms extending from opposite sides of and turned back upon the base. In connection the clip base is received within an appropriate panel slot with the end edges of the spring arms gripping the panel resiliently therebetween with at least one of the end edges bearing upon an adjacent lead ribbon.

Other objects and attainments of the present invention will become apparent to those skilled in the art upon a reading of the following detailed description when taken in conjunction with the drawings in which there are shown and described illustrative embodiments of the invention; it is to be understood however that these embodiments are not intended to be exhaustive nor limiting on the scope of the invention but are given for purposes of illustration in order that others skilled in the art may fully understand the invention and the principles thereof and the manner of applying it in practical use so that they may modify it in various forms each as may be best suited to the conditions of a particular use.

Figures 1, 2, 15, 17:
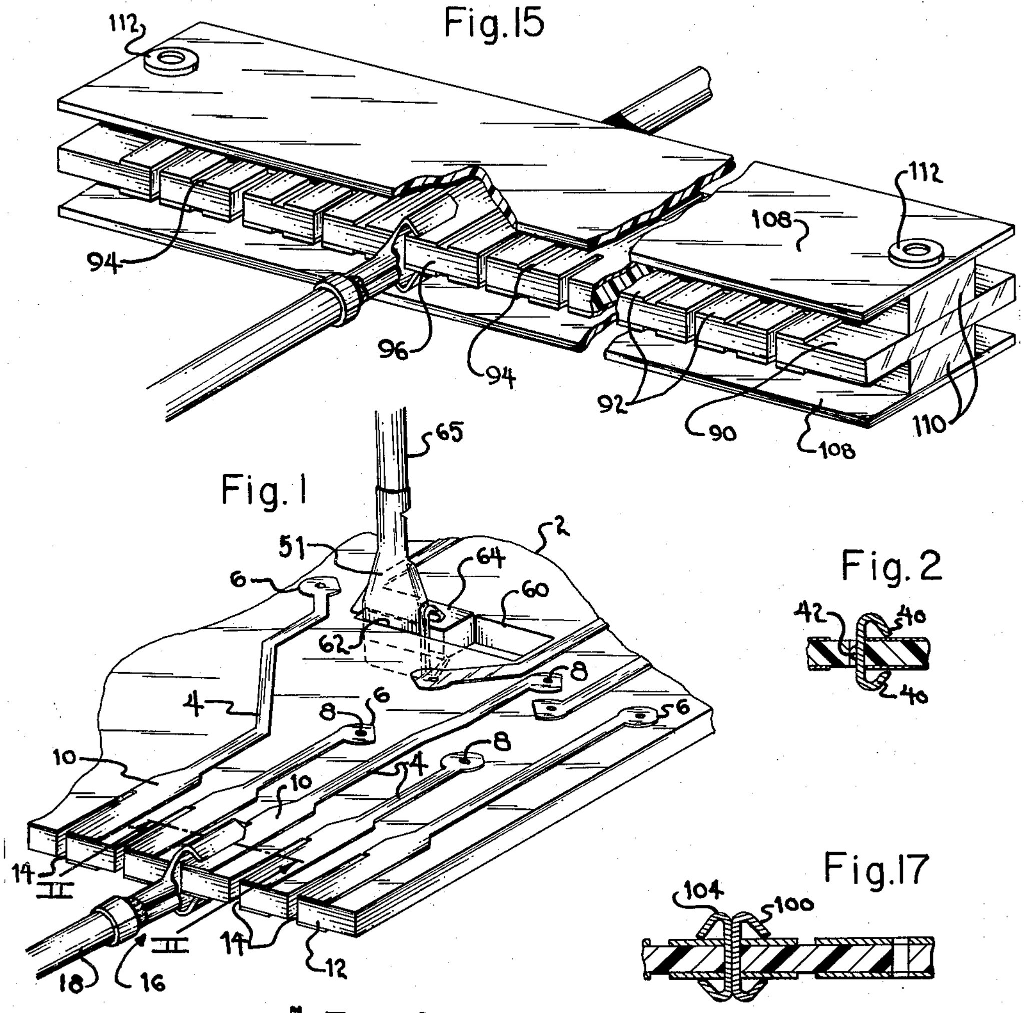
Figure 1 is a fragmentary view in perspective of a printed circuit board having connections made in accordance with the present invention.
Figure 2 is a sectional view taken along lines II—II of Figure 1.
Figure 15 is a view in perspective of a terminal block using the printed circuit connections of the present invention.
Figure 17 is a sectional view taken along lines XVII—XVII of Figure 16.

Referring now to Figure 1, a printed circuit board panel or body 2 of suitable insulation material has reproduced thereon a circuit pattern or design including a plurality of thin narrow strips or ribbons 4 of conductive material which represent the intercomponent wiring of an electronic assembly. The ends 6 of some of strips 4 terminate at apertures 8 into which the leads of components, not shown, such as resistors, coils, tubes, etc., are inserted and then soldered, all as is conventional in the art. The printed circuit design may be composed of strips 4 on either, or as is the usual case, on both sides of panel 2, the connection of my invention being applicable in either case.

The segments or strips ends 10 which constitute the input and output leads of the circuit defined by strips 4 are brought, in accordance with the present invention, to any side edge 12 of panel 2, and, for reasons to become apparent, preferably are widened to several times the approximate 0.025 inch strip width usually sufficient for strips 4. Extending inwardly of side edge 12 adjacent and along strip ends 10 respectively are a plurality of slots 14, each being adapted to receive in electrical connection with the associated strip end 10 a terminal 16 attached to the end of an external lead 18. By bringing strip ends 10 to various edges of the board, it will be apparent that like connections may be made on any side of panel 2 although, as is shown in Figure 1, all connections are conveniently made in practice along one side edge 12. The connection afforded by terminal 16 thus serves to couple external lead wire 18 to the desired input or output strip end 10, any desired number of such connections being provided, corresponding, for example, to the number of input or output leads required to complete incorporation of the circuit of the printed circuit board within the electrical equipment involved.

Figure 3:
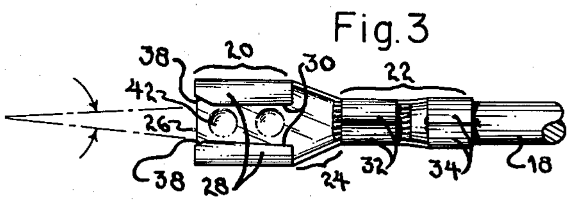
Figure 3 is a plan view of a connector for making one of the connections shown in Figure 1.

Terminal 16, of suitably resilient sheet metal such as No. 4 hard brass, includes a clip portion 20, Figure 3, for contacting strip ends 10, and a coupling portion 22 integrally connected to clip 20 by transition section 24, coupling portion 22 being adapted to affix the terminal electrically and mechanically to lead wire 18 as generally indicated in Figures 1 and 3. With additional reference to Figures 2 and 4, clip 20 comprises a generally rectangular base 26 adapted to be slipped within a slot 14 at right angles to panel 2, and opposed spring arms 28 extending from opposite sides of and turned back upon base 26 to terminate in longitudinally directed linear end edges 30 spaced to engage resiliently the upper and lower faces of panel 2, Figure 2. More particularly, arms 28 are turned back upon base 26 about radii of curvature as large as possible to avoid concentration of stresses during flexure, and extend linearly thereafter outwardly from base 26 to form therewith an open-ended channel for receiving an edge portion of panel 2 as defined by one side of a slot 14. Edges 30, however, are spaced less than any anticipated thickness of panel 2 so that on assembling the connection, these edges forcibly bear on the opposed surfaces of the board and on the conductive strips with which the slot is associated.

In general coupling portion 22 may take a variety of forms but is solderless in nature, that is, a ferrule-forming part adapted to be cold crimped onto the end of lead wire 18 by solderless techniques well known in the art. Such a ferrule typically includes, Figure 4, a U-shaped portion having first upstanding ears 32 adapted for turning inwardly and downwardly upon the exposed metallic core of lead 18 and a second pair of ears 34 which are formed about the insulation, if any, of the lead in the crimping process. Alternatively, coupling portion 22 may be omitted where the function to be served is to couple opposed strips on the upper and lower surfaces of the board. Transition section 24 serves to reduce the wider clip portion to the width of coupling portion 22 and is flanged at edges 36 to lend rigidity to the construction.

Figure 4:
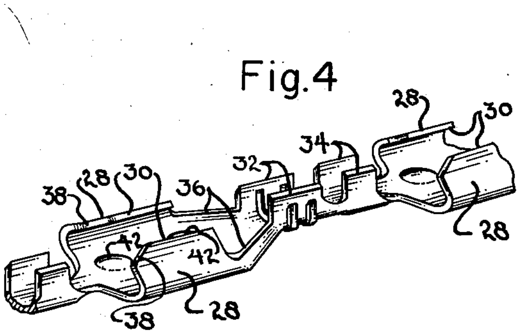
Figure 4 is a fragmentary view in perspective of a strip of sheet metal electrical terminals for making one of the connections shown in Figure 1, the terminals being adapted for application to lead wires by automatic or semi-automatic crimping machines.

It will be apparent that terminal 16 may be formed from sheet metal by conventional blanking and shaping techniques well known in the art, conveniently in strip form, that is, a string of terminals wherein each terminal is joined to others either in end-to-end fashion, Figure 4, or in ladder form, not shown. When thus formed the terminals may be wound in reels for application to leads 18 by automatic or semi-automatic crimping machines.

With coupling portion 22 crimped onto the end of lead wire 18, insertion of clip base 20 within a slot 14 and introduction of an edge portion of the board within the channel defined by the clip cause resilient spring arms 28 to be wedged open and end edges 30 to be brought into forceful engagement with strip ends 10 thereby providing the desired solderless connection between lead wire 18 and printed circuit strips 4. To facilitate application of base 20 to the appropriate slot 14 the forward corners 38 of arms 28 are chamfered or beveled so as to curve away from the insertion end of the clip thus to produce initially a smooth camming action for distending the spring arms. In addition the width of slot 14 will, of course, be wider than the thickness of base 20 to provide a target area of suitable scope for facile indexing of the clip base. The slot width, however, should not be so great as to permit excessive lateral play of the clip which should be stabilized in position as will be described. For reasons to become more apparent the slot width advantageously approximates twice the thickness of the sheet metal forming clip 20.

Electrical continuity between clip 20 and a strip 4 will be seen to be a line contact afforded by end edges 30 bearing on strip ends 10. To avoid damaging the relatively delicate printed circuit strips, typically of the order of .001 inch in thickness, inside corners 40 of end edges 30 are rounded as best shown in the enlarged cross sectional view of Figure 11.

In making the connection, as the clip is slipped into position, the relatively harder metal of the clip is caused at end edges 30 forcefully to bear on a very limited area of the softer metal of the printed circuit strips, commonly a base of copper overlaid with tin. Because of the small area of contact even relatively small distensions of the clip spring arms result in relatively high contact pressures that deform and slightly groove the metal of the strips as end edges 30 progress therealong. Rounded corners 40, however, effectively increase the bearing surface sufficiently to prevent shearing of the conductive strips. Advantageously, the burnishing and grooving action removes any foreign material while exposing fresh metal at the contact surfaces. This self-cleansing action may be enhanced by forming a slight convergence in edges 30 toward the forward or insertion end of the clip, as indicated in Figure 3. The increased contact pressure, resulting from a greater deflection of the spring arms, assures an effectively scrubbed line of contact for subsequent engagement by the more rearwardly portions of the spring arms. In this connection in view of the wider width of slot 14 as compared to the sheet metal thickness of base 20, to prevent shifting of the clip off the established clean line of contact on strip end 10, bosses 42 are preferably raised out of the section of base 20 residing within the board thickness to a height which increases the effective thickness of the base to the width of the slot, as best shown in Figure 2. Bosses 42, however, should be disposed sufficiently back from the insertion end of the clip so as not to interfere with the indexing of base 20 to the desired slot 14.

Figure 5:
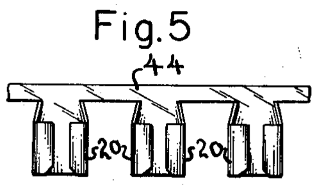
Figure 5 is a plan view of an alternative form of terminal for coupling a series of printed circuit boards arranged in horizontal tiers.

For those printed circuit board applications wherein a plurality of boards are stacked in aligned horizontal tiers, each requiring connections to a common circuit such as a power supply, a series of clip portions 20 may be formed so as to depend laterally from a common strap 44 integrally joining the transition sections thereof as shown in Figure 5. The clips will, of course, be spaced along strap 44 in accordance with the predetermined spacing of the series of printed circuit boards.

Figure 6:
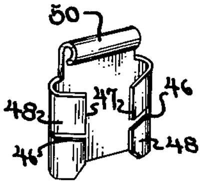
Figure 6 is a view in perspective illustrating another form of terminal for making connections in accordance with the present invention.

In Figure 6, to lend greater resilience to the spring arms and to attain a more uniform distribution of contact pressure along the line of contact, spring arms 48 may have slots 46 extending laterally inwardly of end edges 47 formed therein. At least the forward portions of the spring clip are thus sprung independently of the rigid transition portion of the terminal. Also shown in Figure 6, the terminal may be of flag-type construction for those printed circuit applications wherein only limited space along the board is available. In this construction the wire coupling portion may comprise a rolled ferrule 50 having its longitudinal axis disposed substantially at right angles to the longitudinal axis of the clip portion as shown.

Figure 7:
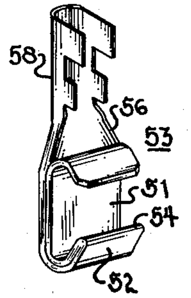
Figure 7 is a view in perspective of another form of terminal for making connections laterally of the printed circuit board as shown in Figure 1.

An alternate form of flag-type construction is shown in Figure 7 wherein the base 51 and one of the arms 52 of the clip portion of terminal 53 are formed in a double layer of sheet metal, the two layers being integrally joined along the end edge 54 of arm 52. Transition section 56 is a lateral continuation of the bottom layer of the double layer base 51 with the longitudinal axis of the ferrule-forming portion 58 laterally extending centrally of the clip portion. Advantageously, on insertion of the clip fully within a slot 14, no portion of the terminal extends beyond the board edge in the plane of the board. In addition this embodiment is suitable for making connections centrally of the board, requiring only that the board be apertured, as at 60 in Figure 1, to permit passage of the clip portion endwise into the board. Aperture 60 includes a slot extension 62 for reception of base 51, strip end 64 being disposed adjacent the slot for contact by the clip arms to effect a connection similar to that as has been described.

Figure 8:
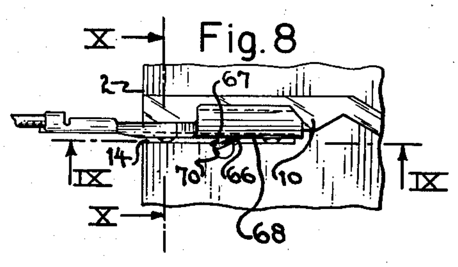
Figure 8 is a fragmentary plan view of another embodiment of the printed circuit board connection of the invention.
Figure 10:
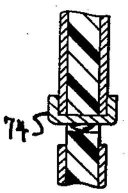
Figure 10 is a sectional view taken along lines X—X of Figure 8.
Figure 9:
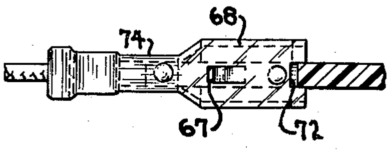
Figure 9 is a sectional view taken along lines IX—IX of Figure 8.

From Figure 1 it can be seen terminal 53 is highly resistant to overstraining by stresses applied thereto from associated lead wire 65 in any direction out of the plane of panel 2 since such stresses must be transmitted through the double layer system and thus tend to be distributed uniformly over the entire width of the spring arms. Advantageously, in any embodiment the spring system of the clip is isolated from all stresses likely to be imposed to avoid over-straining or setting of the spring arms and consequent reduction of the pressure contact afforded thereby. Moreover, the area of contact should remain fixed and stabilized to as high a degree as possible. To these ends, in the connection of Figures 8 through 10, spring detent 66 projects outwardly from base 68 of the terminal, detent 66 cooperating with shoulder 70 provided by a recess opening into slot 14 of panel 2 to secure the terminal against movement longitudinally in the slot. The end 67 of detent 66 is preferably reversely bent to serve as a detent depressing cam whereby the terminal may be disengaged from the board upon a predetermined force being applied thereto. To provide strain relief for the clip spring system the forward end of base 68 is notched as at recess 72, Figure 9, which is of a width closely approximating the thickness of panel 2. Transition section 74 is elongated and generally U-shaped, Figure 10, to form a channel of uniform dimensions approximating in width the thickness of panel 2. As thus constructed, detent 66 is initially depressed during the assembly of the terminal to the board, but snaps behind shoulder 70 as the portion of the panel at the forward end of slot 14 is received in recess 72 and the portion of the panel defined by one side of slot 14 is received within channel 74, thereby firmly securing base 68 against significant movement in any direction. It will be understood that spring arms 28 are sufficiently flexible to absorb without taking a permanent set the slight deflection permitted by the play of panel 2 within recess 72 and channel 74 as a result of dimensional variations within design tolerances.

Figure 12:
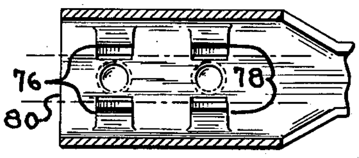
Figure 12 is a sectional view of the terminal element of the connection of Figure 11 taken at lines XII—XII of Figure 11.
Figure 11:
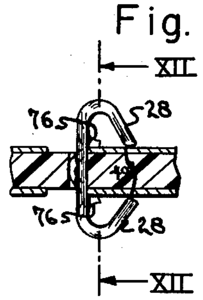
Figure 11 is a sectional view of a further embodiment of the printed circuit board connection according to the present invention.

Figures 11 and 12 illustrate another form that the strain relief may take. As shown, two pairs of opposed tabs 76 and 78 are struck inwardly of base 80, the ends of the tabs of each pair being substantially equidistant from the longitudinal center of the base and spaced apart approximately equal to the width or thickness of the printed circuit board. Tabs 76 and 78 are short and relatively rigid as compared to spring arms 28 and thus act to absorb any stresses imposed on the terminal upon receiving the panel therebetween as best shown in Figure 11.

Figure 14:
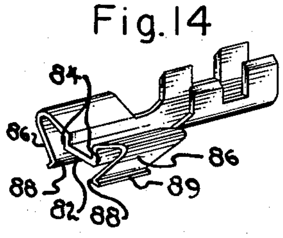
Figure 14 is a view in perspective of a terminal for making the connection of Figure 13.
Figure 13:
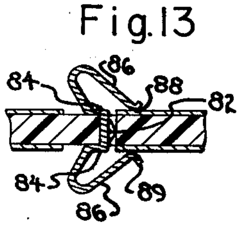
Figure 13 is a sectional view of another embodiment of the printed circuit board connection of the invention.

In the embodiment illustrated in Figures 13 and 14 the strain relief desired may be attained by imparting a panel-receiving channel configuration to the clip base as a whole, the channel being a general continuation of the U-shaped configuration of the terminal coupling portion and transition section for convenience in the forming operation, as best shown in Figure 14. Accordingly, the clip base includes a flat channel bottom 82 from the side edges of which perpendicularly extend opposed channel side walls 84 that are spaced approximately the thickness of panel 2 whereby snugly to receive an edge portion of panel 2, Figure 13. Spring arms 86 then integrally extend from the ends of side walls 84 to impart the general channel-like configuration to the clip, for example, first outwardly and away from the plane and central axis of the clip before being reversely turned inwardly after the manner of the embodiments previously described, which configuration advantageously increases the length of the spring arms and the effectiveness of the spring system. The free spacing of contact surfaces 88 may then be decreased relative to the board thickness to grip more firmly circuit boards of minimum thickness within the design tolerance range without taking a permanent set when applied to circuit broads of maximum thickness within the range. In this event to avoid damaging the conductive strips end edges 89 are preferably turned up to increase the area of contact surfaces 88 for more widely distributing the increased loading.

Figure 16:
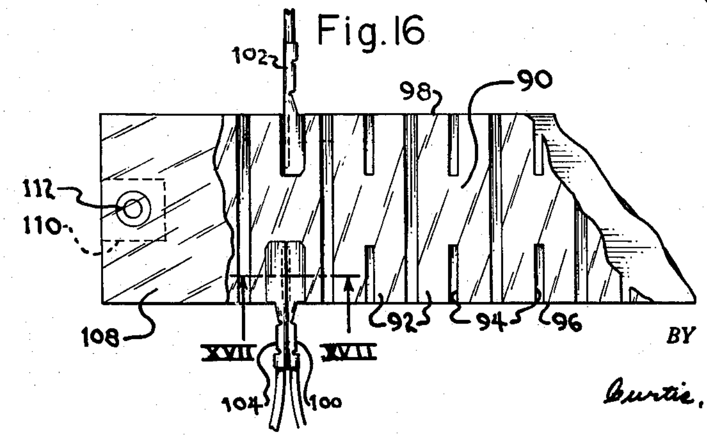
Figure 16 is a plan view of the terminal block of Figure 15 with parts broken away for purposes of illustration.

In the embodiments thus far described the connection has been described in relation to printed circuit boards for carrying electronic subassemblies including resistors, condensers, etc. and their associated wiring. Alternatively, in Figures 15, 16, and 17, printed wiring panel 90 may be generally rectangular in form and elongated to comprise the connective element of a terminal block arrangement, printed circuit strips 92 extending from associated terminal receiving slots 94 on one long side 96 in any desired pattern or design to the other long side 98 of panel 90. In the illustrated embodiment conductive strips 92 lead directly from the series of slots on one side of panel 90 to respectively opposed slots on the opposite side to provide a series of straight-through connections, for example between terminal 100 on side 96 to terminal 102 on side 98 of the block. In this connection by omitting any space take-up bosses in the base of the terminal clip portion and arranging slots 94 to be centrally disposed in a wider printed circuit strip, a pair of terminals 100 and 104 may be disposed base-to-base, or back-to-back within a single slot, as shown in Figures 16 and 17, each strip thus serving as a four-wire common bus. It will be understood, however, that in general by suitably printing strips 92 on either one or both faces of panel 2, a terminal on one side of the board may be connected to any desired number of terminals on either the opposite or same side of the terminal block. Cover plates 108 of insulation material, spatially disposed by spacer blocks 110 and secured relative to panel 90 by eyelets or rivets 112, may be added if desired.

The several embodiments illustrated by the foregoing description each achieve the stated objectives, primarily being the provision of a solderless frictional-fit connection for printed circuit applications which is versatile, of high electrical and mechanical quality, simple in assembly and inexpensive in construction. It will be apparent that the basic principles disclosed admit of many other modifications within the scope of the invention which will occur to those skilled in the art. By way of specific example dimensionally, however, good results can be obtained in a connection formed in accordance with the embodiment of Figures 1 to 4 wherein panel 2 is 0.062±0.005 in thickness, slots 14 being spaced along the panel edge on 0.156 centers and each having a width of 0.020 and a length of 0.210, and strips 4 (tin-clad copper) being 0.001 in thickness with strip ends 10 being 0.100 in width, all dimensions being in inches. Terminal 16 may be formed of No. 4 hard tin-plated brass 0.010 in thickness, clip portion 20 being 0.200 in length and 0.153 in width and having spring arms turned about a 0.020 radius to extend at approximately a 30° angle to base 26 and to a height of 0.080 thereabove. The relative spacing of edges 30 approximates 0.050 at the trailing end and converge to approximately 0.046 at the leading or insertion end, the inside corners being broken about a radius of approximately 0.003. A pair of bosses 42 raised to 0.010 out of base 26 adequately serve to stabilize the clip laterally in the slot and edges 30 on the established line of contact with strip ends 10 which, it will be observed, are sufficiently wide, relative to the overhang, of spring arms 28 over the panel face, to accommodate substantial variation in the location of the contact line.

I claim:

1. An electrical connection comprising a sheet metal terminal having a coupling portion and a clip portion, said clip portion including a base and a pair of lateral arms extending from opposite sides of and turned back upon said base to form resilient spring elements, a printed circuit panel having a ribbon of conductive material affixed to the surface of the insulating material body thereof, a slot in said body adjacent said ribbon for receiving said clip base with the opposed end edges of said arms gripping said panel therebetween, one of said end edges bearing upon said ribbon, said coupling portion connecting said terminal to electrical circuitry external of said panel.

2. An electrical connection comprising a sheet metal terminal having a coupling portion and a clip portion, said clip portion including a base and a pair of lateral arms extending from opposite sides of and turned back upon said base to form resilient spring elements, a printed circuit panel having a ribbon of conductive material on the printed face of the insulating material body thereof, said ribbon extending to a side edge of the panel, a slot in said body extending from said side edge and adjacent said ribbon, said slot receiving said clip base with the opposed longitudinal end edges of said arms gripping said panel therebetween, at least one of said end edges being smoothly rounded and bearing upon said ribbon, said coupling portion connecting said terminal to electrical circuitry external of said panel.

3. An electrical connection comprising a printed circuit panel having a network of conductive metallic ribbons on at least one face of the insulating material body thereof, a plurality of said ribbons forming the input and output leads of said network being widened and brought to at least one side edge of said panel, a plurality of slots extending inwardly in said panel from said side edge and adjacent the lead ribbons respectively, a channel-shaped sheet metal clip having a base and opposed extensions integrally extending from opposite sides of said base, said extensions providing spring means and at least one contact edge extending longitudinally of said channel, the edge portion of said panel defined by one side of a slot being received in the channel of said clip with said base in said slot and said spring means resiliently urging said contact edge into engagement with the associated conductive ribbon, the remainder of said slots being adapted to receive like clips to form similar connections.

4. An electrical connection comprising a printed circuit panel having a network of conductive metallic ribbons on at least one face of the insulating material body thereof, a plurality of said ribbons forming the input and output leads of said network being widened and brought to at least one side edge of said panel, a plurality of slots extending inwardly in said panel from said side edge and adjacent the lead ribbons respectively, a sheet metal terminal having a coupling portion for connecting the terminal to electrical circuitry external of the panel and a clip portion, said clip portion including a base and a pair of lateral arms extending from opposite sides of and turned back upon said base to form resilient spring elements, said clip base being received within one of said slots with the opposed end edges of said arms gripping said panel therebetween, at least one of said end edges bearing upon the associated lead ribbon, the remainder of said slots being adapted to receive like terminals for connecting said network in an including electrical circuit.

5. A sheet metal terminal for frictionally engaging the conductive ribbon of a printed circuit panel having a slot adjacent the ribbon comprising a coupling portion for connecting the terminal to electrical circuitry external of the circuit panel, and an integral channel-shaped clip portion having a base and a pair of lateral arms extending from opposite sides of said base, said arms providing spring means and at least one contact element, the channel of said clip being adapted to receive an edge portion of the panel as defined by one side of the slot with said spring means resiliently urging said contact element into engagement with the ribbon, and inflexible strain relieving means including opposed portions of the base spaced approximately the thickness of the panel and arranged to engage opposite sides of the panel for isolating said spring means from lateral stresses in excess of the elastic limit thereof.

6. A sheet metal terminal as set forth in claim 5 wherein said strain relieving means includes a longitudinal slot extending from the forward edge of said base and an open-sided channel longitudinally extending from the rear of said base, said slot and said channel being of a width approximately the thickness of the panel and disposed to receive edge portions of the panel upon insertion of the terminal in the panel slot.

7. A sheet metal terminal as set forth in claim 5 wherein said strain relieving means includes opposed substantially inflexible tabs turned up from said base, the end portions of opposed tabs being spaced at least equal to the thickness of the panel and disposed to receive a panel edge portion therebetween upon insertion of the terminal in the panel slot.

8. A connection as set forth in claim 5 wherein the base of said channel is channel-shaped for receiving the edge portion of said panel defined by the other side of said said slot.

9. A sheet metal terminal as set forth in claim 5 wherein the end edges of said arms linearly converge toward the insertion end of said clip.

10. A sheet metal terminal as set forth in claim 5 wherein said base is provided with at least one boss therein for increasing the effective thickness thereof to substantially the width of the slot.

11. A sheet metal terminal for frictionally engaging the conductive ribbon of a printed circuit panel having a slot adjacent the ribbon comprising a coupling section for connecting the terminal to electrical circuitry external of the circuit panel; and an integral clip section including a base having portions extending outwardly of the general plane of the base to define a channel for receiving an edge portion of the panel defined by a side of the slot, and a pair of lateral arms extending from opposite sides of said base, said arms being turned back upon said base to form therewith a channel for receiving the edge portion of the panel defined by a side of the slot, said arms providing a contact element and spring means for resiliently urging said contact element into engagement with the ribbon upon insertion of said clip base into the slot.

12. A connection as set forth in claim 11 wherein means projecting from the base of said channel provide effectively a secondary channel of lesser depth, said secondary channel receiving an edge portion of said panel defined by said slot for strain relief of said spring means.

13. An electrical connection comprising a sheet metal terminal having a coupling portion and a clip portion, said clip portion including a base and a pair of lateral arms extending from opposite sides of and turned back upon said base to form resilient spring elements, a yieldable detent integrally projecting from said base, a printed circuit panel having a ribbon of conductive material affixed to the surface of the insulating material body thereof, an elongated slot in said body adjacent said ribbon receiving said clip base with the opposed end edges of said arms gripping the panel therebetween, one of said end edges bearing upon said ribbon, a shoulder in said body extending laterally of said slot and cooperating with said detent to secure the terminal on said panel, said coupling portion connecting said terminal to electrical circuitry external of said panel.

References Cited in the file of this patent

UNITED STATES PATENTS

| | | |
|---|---|---|
| 2,477,940 | Ready | Aug. 2, 1949 |
| 2,575,819 | Laird | Nov. 20, 1951 |
| 2,579,739 | Hayes | Dec. 25, 1951 |
| 2,616,994 | Luhn | Nov. 4, 1952 |
| 2,693,584 | Pifer | Nov. 2, 1954 |
| 2,707,272 | Blitz | Apr. 26, 1955 |
| 2,734,997 | Frady | Feb. 14, 1956 |
| 2,741,750 | Barre | Apr. 10, 1956 |
| 2,741,751 | Weiler | Apr. 10, 1956 |
| 2,744,244 | Schumacher et al. | May 1, 1956 |
| 2,774,952 | Batcheller | Dec. 18, 1956 |
| 2,790,961 | Del Camp | Apr. 30, 1957 |
| 2,820,212 | Batcheller | Jan. 14, 1958 |
| 2,825,010 | Silverschotz | Feb. 25, 1958 |

OTHER REFERENCES

AMP Electronic Design, November 15, 1956, page 17.